(12) United States Patent
Walker et al.

(10) Patent No.: US 12,686,072 B2
(45) Date of Patent: Jul. 21, 2026

(54) CONDUCTIVE PINS, POWER MODULES, ULTRASONIC WELDING SYSTEMS, AND METHODS OF USING THE SAME

(71) Applicant: Kulicke and Soffa Industries, Inc., Fort Washington, PA (US)

(72) Inventors: Todd J. Walker, Huntington Beach, CA (US); Omid Niayesh, Irvine, CA (US); Henri Seppaenen, Irvine, CA (US)

(73) Assignee: Kulicke and Soffa Industries, Inc., Fort Washington, PA (US)

( * ) Notice: Subject to any disclaimer, the term of this patent is extended or adjusted under 35 U.S.C. 154(b) by 0 days.

(21) Appl. No.: 18/966,707

(22) Filed: Dec. 3, 2024

(65) Prior Publication Data

US 2025/0187103 A1     Jun. 12, 2025

Related U.S. Application Data

(60) Provisional application No. 63/607,533, filed on Dec. 7, 2023.

(51) Int. Cl.
| | |
|---|---|
| *B23K 20/00* | (2006.01) |
| *B23K 20/10* | (2006.01) |
| *H10W 72/50* | (2026.01) |
| *B23K 101/36* | (2006.01) |
| *H10W 70/05* | (2026.01) |

(52) U.S. Cl.
CPC ........... *B23K 20/106* (2013.01); *H10W 72/50* (2026.01); *B23K 2101/36* (2018.08); *H10W 70/093* (2026.01)

(58) Field of Classification Search
CPC ...... B23K 20/10; B23K 20/106; B23K 20/26; B23K 20/002; B23K 37/04; B23K 31/125; B23K 20/12
See application file for complete search history.

(56) References Cited

U.S. PATENT DOCUMENTS

| | | | | |
|---|---|---|---|---|
| 3,573,781 | A | * | 4/1971 | Shoh ...................... B23K 20/10 |
| | | | | 310/317 |
| 3,693,158 | A | * | 9/1972 | Uthe ...................... G01N 29/34 |
| | | | | 228/110.1 |
| 3,697,837 | A | * | 10/1972 | Umbaugh ............ B23K 20/023 |
| | | | | 318/128 |

(Continued)

FOREIGN PATENT DOCUMENTS

WO     WO2024220203 A1     10/2024

OTHER PUBLICATIONS

The Welder (Understanding Ultrasonic Welding, https://www.thefabricator.com/thewelder/article/arcwelding/understanding-ultrasonic-welding, using wayback machine, May 30, 2023) (Year: 2023).*

(Continued)

*Primary Examiner* — Erin B Saad
(74) *Attorney, Agent, or Firm* — Christopher M. Spletzer, Sr.

(57)     ABSTRACT

A conductive pin for ultrasonic welding is provided. The conductive pin includes a body portion. The conductive pin also includes a pin head at one end of the body portion. The pin head defines a bonding surface configured to be ultrasonically welded to a workpiece. The bonding surface includes at least one of (i) a nonplanar surface and (ii) an aperture defined in a central region of the bonding surface.

19 Claims, 9 Drawing Sheets

(56)                    References Cited

U.S. PATENT DOCUMENTS

| | | | | | |
|---|---|---|---|---|---|
| 3,727,822 | A | * | 4/1973 | Umbaugh | B23K 31/125 |
| | | | | | 228/8 |
| 4,012,103 | A | * | 3/1977 | Lunquist | A61N 1/3752 |
| | | | | | 200/51.09 |
| 4,171,644 | A | * | 10/1979 | Beller | G01N 29/30 |
| | | | | | 73/631 |
| 5,292,054 | A | * | 3/1994 | Leeb | H10W 40/037 |
| | | | | | 228/183 |
| 5,294,829 | A | * | 3/1994 | Hundt | G11C 5/141 |
| | | | | | 257/691 |
| 8,197,624 | B2 | * | 6/2012 | Beehag | B29C 66/474 |
| | | | | | 156/73.1 |
| 8,434,768 | B2 | * | 5/2013 | Schug | B23K 9/206 |
| | | | | | 219/98 |
| 8,563,364 | B2 | * | 10/2013 | Stolze | H10W 70/093 |
| | | | | | 438/106 |
| 10,882,134 | B2 | * | 1/2021 | Luechinger | B23K 20/10 |
| 10,903,587 | B2 | * | 1/2021 | Spinella | B23K 35/0288 |
| 11,364,565 | B2 | * | 6/2022 | Luechinger | B23K 37/0235 |
| 11,698,091 | B2 | * | 7/2023 | Hill | B23K 11/0066 |
| | | | | | 228/113 |
| 11,850,676 | B2 | * | 12/2023 | Copperthite | B23K 20/002 |
| 11,898,596 | B2 | * | 2/2024 | Grojean | B23K 11/20 |
| 12,070,814 | B2 | * | 8/2024 | Copperthite | B23K 37/04 |
| 12,370,620 | B2 | * | 7/2025 | Sharma | B23K 20/002 |
| 2002/0062901 | A1 | * | 5/2002 | Couillard | B29C 66/21 |
| | | | | | 156/73.1 |
| 2006/0213954 | A1 | * | 9/2006 | Ruther | B21J 15/027 |
| | | | | | 228/114.5 |
| 2007/0251979 | A1 | * | 11/2007 | Mauer | F16B 11/004 |
| | | | | | 228/2.3 |
| 2009/0114459 | A1 | * | 5/2009 | Fukushima | G06F 3/03545 |
| | | | | | 178/19.03 |
| 2010/0025453 | A1 | * | 2/2010 | Geissler | H01L 24/78 |
| | | | | | 228/103 |
| 2015/0336329 | A1 | * | 11/2015 | Lehmann | B29C 66/21 |
| | | | | | 264/445 |
| 2016/0023297 | A1 | * | 1/2016 | Stroh | B06B 3/00 |
| | | | | | 228/1.1 |
| 2016/0354974 | A1 | * | 12/2016 | Wang | B23K 20/106 |
| 2018/0161914 | A1 | * | 6/2018 | Hauck | B23K 31/125 |
| 2021/0359445 | A1 | * | 11/2021 | Tolentino | H01R 12/73 |
| 2021/0379690 | A1 | * | 12/2021 | Copperthite | H05K 3/328 |
| 2022/0324060 | A1 | * | 10/2022 | Kurpiewski | B23K 20/004 |
| 2025/0289074 | A1 | | 9/2025 | Walker et al. | |

OTHER PUBLICATIONS

CN-216905460-U computer English translation (Year: 2022).*

* cited by examiner

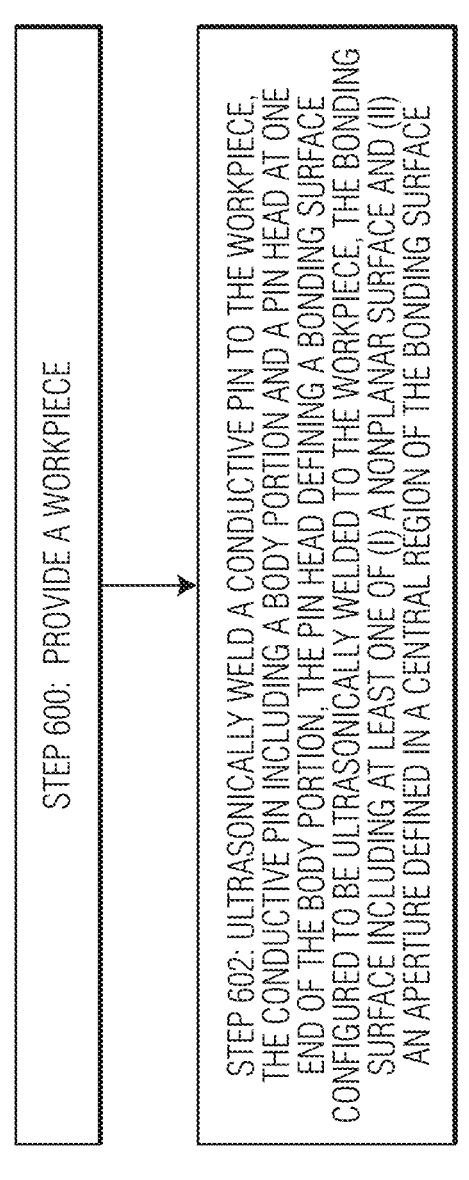

STEP 600:  PROVIDE A WORKPIECE.

STEP 602: ULTRASONICALLY WELD A CONDUCTIVE PIN TO THE WORKPIECE, THE CONDUCTIVE PIN INCLUDING A BODY PORTION AND A PIN HEAD AT ONE END OF THE BODY PORTION, THE PIN HEAD DEFINING A BONDING SURFACE CONFIGURED TO BE ULTRASONICALLY WELDED TO THE WORKPIECE, THE BONDING SURFACE INCLUDING AT LEAST ONE OF (I) A NONPLANAR SURFACE AND (II) AN APERTURE DEFINED IN A CENTRAL REGION OF THE BONDING SURFACE

FIG. 6

CONDUCTIVE PINS, POWER MODULES, ULTRASONIC WELDING SYSTEMS, AND METHODS OF USING THE SAME

CROSS-REFERENCE TO RELATED APPLICATION

This application claims the benefit of U.S. Provisional Application No. 63/607,533, filed Dec. 7, 2023, the content of which is incorporated herein by reference.

FIELD

The invention relates to the ultrasonic welding, and more particularly, to improved systems and methods for performing ultrasonic welding operations including conductive pin welding.

BACKGROUND

Ultrasonic energy is widely used in forming interconnections between two or more materials. For example, wire bonding systems (e.g., ball bonding machines, wedge bonding machines, ribbon bonding machines, etc.) are used to bond a wire or ribbon to a bonding location. Wire bonding utilizes relatively low levels of energy (e.g., bond force, ultrasonic energy, etc.). Exemplary wire bonding systems are marketed by Kulicke and Soffa Industries, Inc. of Fort Washington, Pennsylvania.

Certain applications involve joining of materials other than wire. Welding has been considered for such applications. Ultrasonic welding is also a widely used technology. Ultrasonic welding may use an ultrasonic converter (e.g., carrying a sonotrode) for converting electrical energy into mechanical movement/scrub (e.g., linear movement/scrub, torsional movement/scrub, etc.). However, existing ultrasonic welding technology and equipment is limited in its ability to provide solutions that can satisfy market demand in terms of cost, operational efficiency, flexibility, portability, and related factors.

U.S. Pat. No. 10,882,134 (entitled "Ultrasonic Welding Systems and Methods of Using the Same"), U.S. Pat. No. 11,364,565 (entitled "Ultrasonic Welding Systems and Methods of Using the Same"), and U.S. Pat. Nos. 11,850, 676 and 12,070,814 (entitled "Ultrasonic Welding Systems, Methods of Using the Same, and Related Workpieces Including Welded Conductive Pins") assigned to Kulicke and Soffa Industries, Inc., relate to improvements in ultrasonic welding technology, and are incorporated by reference in their entirety.

Still, improvements are needed in connection with applications of ultrasonic welding, including ultrasonic pin welding (where such pins are often solder and/or press fit into power modules). Thus, it would be desirable to improve ultrasonic welding technology including ultrasonic pin welding.

SUMMARY

According to an exemplary embodiment of the invention, a conductive pin for ultrasonic welding is provided. The conductive pin includes a body portion. The conductive pin also includes a pin head at one end of the body portion. The pin head defines a bonding surface configured to be ultrasonically welded to a workpiece. The bonding surface includes at least one of (i) a nonplanar surface and (ii) an aperture defined in a central region of the bonding surface.

According to other embodiments of the invention, the conductive pin recited in the immediately preceding paragraph may have any one or more of the following features: the bonding surface includes the nonplanar surface; the nonplanar surface is a curved surface; the curved surface has a radius of curvature between 2 mm and 100 mm; the bonding surface includes the aperture defined in the central region of the bonding surface; the aperture includes a maximum depth of between 10 µm and 1000 µm; the aperture extends through a full length of the body portion of the conductive pin; the aperture is a conical aperture; the aperture is a curved aperture; the curved aperture has a radius of curvature between 2 mm and 100 mm; the aperture is a cylindrical aperture; the nonplanar surface is an angled surface; the angled surface is configured at an angle of between 1 degree and 15 degrees with respect to a horizontal plane, the horizontal plane being perpendicular to a longitudinal direction of the body portion; and/or the bonding surface is configured to be ultrasonically welded to a workpiece using torsional vibration.

According to another exemplary embodiment of the invention, a power module is provided. The power module includes a semiconductor element. The power module also includes a carrier for supporting the semiconductor element. The power module also includes at least one conductive pin ultrasonically welded to the carrier. The conductive pin includes a body portion and a pin head at one end of the body portion. The pin head defines a bonding surface that is welded to the carrier. The bonding surface of the conductive pin, prior to being ultrasonically welded to the carrier, included at least one of (i) a nonplanar surface and (ii) an aperture defined in a central region of the bonding surface.

According to other embodiments of the invention, the power module recited in the immediately preceding paragraph may have any one or more of the following features: the bonding surface included the nonplanar surface prior to being ultrasonically welded to the carrier; the nonplanar surface was a curved surface; the curved surface had a radius of curvature between 2 mm and 100 mm; the bonding surface included the aperture defined in the central region of the bonding surface prior to being ultrasonically welded to the carrier; the aperture included a maximum depth of between 10 µm and 1000 µm; the aperture extends through a full length of the body portion of the conductive pin; the aperture was a conical aperture; the aperture was a curved aperture; the curved aperture had a radius of curvature between 2 mm and 100 mm; the aperture was a cylindrical aperture; the nonplanar surface was an angled surface; the angled surface was configured at an angle of between 1 degree and 15 degrees with respect to a horizontal plane, the horizontal plane being perpendicular to a longitudinal direction of the body portion; and/or the bonding surface was configured to be ultrasonically welded to a workpiece using torsional vibration.

According to yet another exemplary embodiment of the invention, an ultrasonic welding system configured for welding a conductive pin to a workpiece is provided. The ultrasonic welding system includes a sonotrode configured to ultrasonically weld the conductive pin to the workpiece during a welding process. The ultrasonic welding system also includes a control system configured to control the welding process, the welding process including bonding a bonding surface of the conductive pin to the workpiece, the bonding surface including at least one of (i) a nonplanar surface and (ii) an aperture defined in a central region of the bonding surface.

According to other embodiments of the invention, the ultrasonic welding system recited in the immediately preceding paragraph may have any one or more of the following features: the control system is configured to apply process parameters during the welding process based on the bonding surface; the bonding surface includes the nonplanar surface, the control system is configured to apply process parameters during the welding process based on the nonplanar surface; the bonding surface includes the aperture defined in the central region, the control system is configured to apply process parameters during the welding process based on the aperture defined in the central region; the bonding surface includes the nonplanar surface and the aperture defined in the central region of the nonplanar surface, the control system is configured to apply process parameters during the welding process based on the nonplanar surface and the aperture defined in the central region of the nonplanar surface; the process parameters include at least one of bonding force, bonding energy, and bonding time; and/or the welding process utilizes torsional vibration applied by the sonotrode. Further, it should be understood that any one or more of the features of a conductive pin and/or a power module described in the preceding paragraphs in this summary can be used in connection with the ultrasonic welding system.

According to yet another exemplary embodiment of the invention, a method of ultrasonically welding a conductive pin to a workpiece is provided. The method includes the steps of: (a) providing a workpiece; and (b) ultrasonically welding the conductive pin to the workpiece, the conductive pin including a body portion; and a pin head at one end of the body portion, the pin head defining a bonding surface configured to be ultrasonically welded to the workpiece, the bonding surface including at least one of (i) a nonplanar surface and (ii) an aperture defined in a central region of the bonding surface.

According to other embodiments of the invention, the method recited in the immediately preceding paragraph may have any one or more of the following features: step (b) includes applying process parameters, using a control system, during the ultrasonic welding based on the bonding surface; step (b) includes applying process parameters, using a control system, during the ultrasonic welding based on the nonplanar surface; step (b) includes applying process parameters, using a control system, during the ultrasonic welding based on the aperture defined in the central region; step (b) includes applying process parameters, using a control system, during the ultrasonic welding based on the nonplanar surface and the aperture defined in the central region of the nonplanar surface; step (b) includes applying process parameters, using a control system, during the ultrasonic welding, the process parameters including at least one of bonding force, bonding energy, and bonding time; and/or step (b) includes applying process parameters, using a control system, during the ultrasonic welding, the ultrasonic welding utilizing torsional vibration applied by a sonotrode configured to ultrasonically weld the conductive pin to the workpiece. Further, it should be understood that any one or features of a conductive pin and/or a power module described in the preceding paragraphs in this summary can be used in connection with the ultrasonic welding system.

BRIEF DESCRIPTION OF THE DRAWINGS

The invention is best understood from the following detailed description when read in connection with the accompanying drawings. It is emphasized that, according to common practice, the various features of the drawings are not to scale. On the contrary, the dimensions of the various features are arbitrarily expanded or reduced for clarity. Included in the drawings are the following figures:

FIG. 6 is a flow diagram of a method of ultrasonically welding a conductive pin to a workpiece in accordance with various exemplary embodiments of the invention.

DETAILED DESCRIPTION

Certain exemplary embodiments of the invention relate to ultrasonic welding systems, and methods of using the same, for example, in connection with conductive pins and/or power modules. Such ultrasonic welding systems may be used for welding conductive pins (and/or copper terminals or other conductive terminals) to a workpiece (e.g., a substrate, a carrier, etc.).

Ultrasonic welding systems typically include an ultrasonic welding converter. Such converters may be designed to operate, for example, in a linear mode/motion, or in a torsional mode/motion. For example, a linear ultrasonic converter carries a sonotrode, and during operation a contact portion of the sonotrode will vibrate ultrasonically in a substantially linear motion. In contrast, a torsional ultrasonic converter carries a sonotrode, and during operation the concave portion of the sonotrode will vibrate ultrasonically in a substantially rotational/torsional motion.

Certain ultrasonic welding systems, such as pin welding machines, may be used to weld/bond conductive pins to a workpiece. Conventional bonding surfaces (i.e., the welded side) of conductive pins for ultrasonic welding are almost universally substantially flat, or planar, surfaces with varying degrees of surface roughness. Conventional conductive pins typically have an underside (the welded side) that has a substantially flat profile. In conventional torsional pin welding, the center point of the bonding surface of the conductive pin (i.e., a point coincident with the axis of rotation of the conductive pin and/or sonotrode) may not experience sufficient bonding energy. Consequently, the bonded interface between the conductive pin and the workpiece (e.g., a carrier) may exhibit stress concentrations (e.g., due to nonuniform bonding or insufficient bonding), delamination, fatigue points, poor conductivity, or other bonding issues. Certain aspects of the invention address such problems associated with conventional bonding surfaces of conductive pins.

According to certain aspects of the invention, a pin head of a conductive pin may have a bonding surface that is nonplanar. The bonding surface may be considered to have a non-planar profile. Examples of non-planar profiles include a sloped profile, an angled profile, a curved profile, among others described herein and/or within the scope of the invention. The non-planar bonding surface of the pin head can substantially improve welded conductive pin connection.

According to certain aspects of the invention, a pin head of a conductive pin may have a bonding surface that includes an aperture defined in a central region of the bonding surface.

Figure 1:
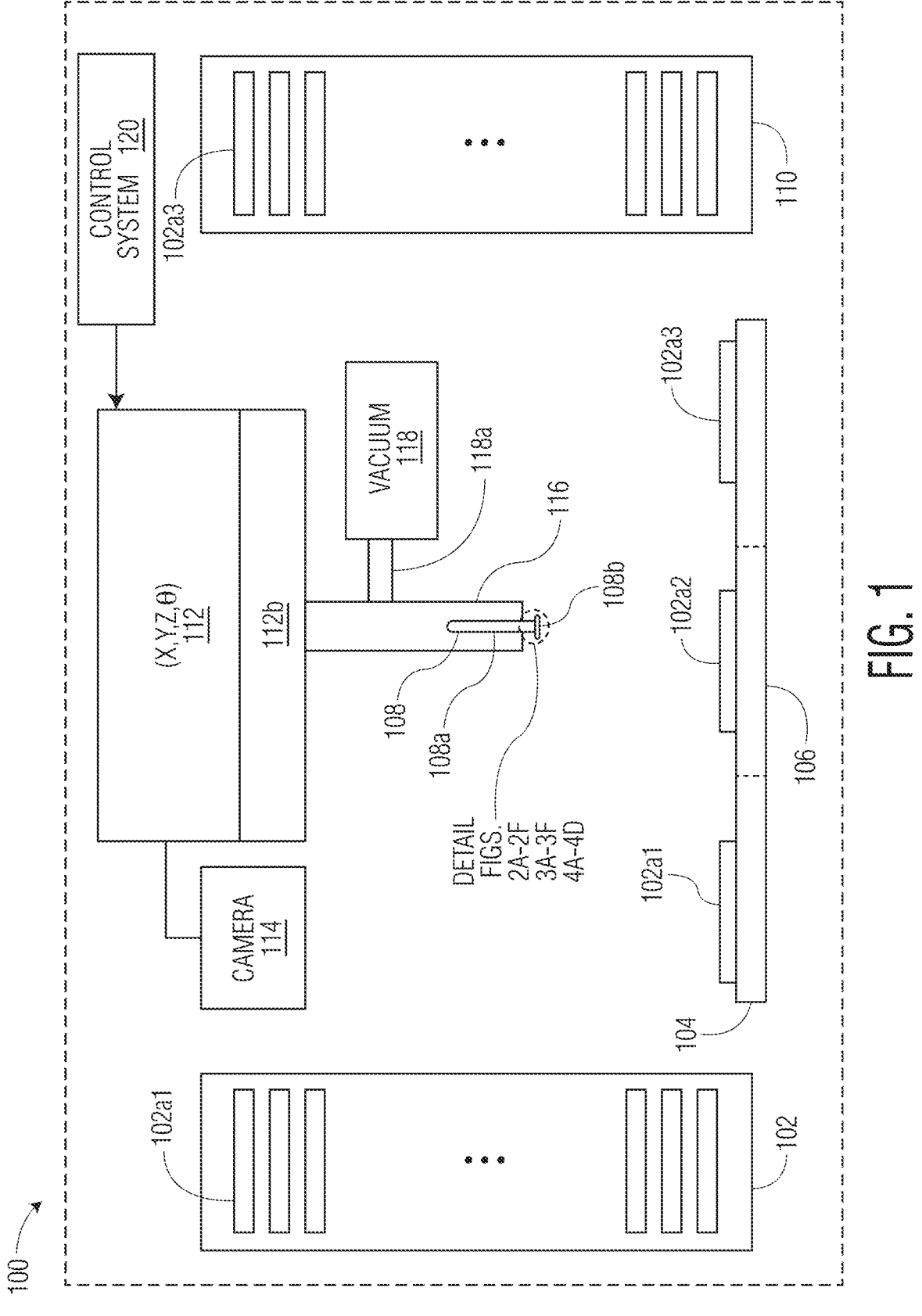
FIG. 1 is a block diagram side view of an ultrasonic welding system in accordance with an exemplary embodiment of the invention.

Referring now to the drawings, FIG. 1 illustrates an ultrasonic welding system 100. Ultrasonic welding system 100 is configured to ultrasonically weld a conductive pin (e.g., a conductive pin 108, 208, 308, 408 of FIGS. 1, 2A-2F, 3A-3F, and 4A-4D, respectively) to a workpiece (e.g., workpiece 102a1, 102a2, 102a3, a carrier, etc.). Ultrasonic welding system 100 includes an input workpiece supply 102 for providing a workpiece 102a1, where input workpiece supply 102 is configured to carry a plurality of workpieces 102a1 (e.g., workpiece supply 102 may be a magazine handler for carrying a plurality of workpieces 102a1 or other supply structure suitable for the application specific workpiece, etc.). Exemplary workpieces 102a1 carried by input workpiece supply 102 include semiconductor elements, power modules, carriers, components of power modules, lead frames, battery modules, etc. Workpieces 102a1 are provided (by any desired transport assembly which may be included in a material handling system 104, such as a gripper assembly) from input workpiece supply 102 to material handling system 104.

Material handling system 104 moves workpiece 102a1 (e.g., using a conveyor assembly, using a gripper assembly, etc.) to a support structure 106. Support structure 106 supports the workpiece (now labelled as a clamped workpiece 102a2, when clamped against support structure 106 using a workpiece clamp) during a welding operation. After the welding operation (described below with respect to a weld head assembly 112), a now welded workpiece 102a3 is moved (e.g., using a conveyor assembly, using a gripper assembly, etc.) from a portion of material handling system 104 downstream of support structure 106 to an output workpiece supply 110. Output workpiece supply 110 is configured to receive welded workpieces 102a3 after processing by weld head assembly 112. Output workpiece supply 110 may be a magazine handler for carrying a plurality of welded workpieces 102a3 or another supply structure suitable for the application specific workpiece.

Ultrasonic welding system 100 includes weld head assembly 112. Weld head assembly 112 includes ultrasonic converter 112b carrying a sonotrode 116, and is moveable along a plurality of substantially horizontal axes. In the example shown in FIG. 1, weld head assembly 112 is configured to move along the x-axis and the y-axis of ultrasonic welding system 100. In the example shown in FIG. 1, weld head assembly 112 is also configured to move along the z-axis of ultrasonic welding system 100, and about a theta axis (Ø-axis) of ultrasonic welding system 100. Not all of these motion axes are required in each application. Using the motion axes of weld head assembly 112, sonotrode 116 is able to be moved into proper welding positions with respect to clamped workpiece 102a2. Camera 114 is also provided (where camera may optionally be carried by weld head assembly 112, or may be carried by another part of ultrasonic welding system 100) for imaging operations related to the alignment between sonotrode 116 and clamped workpiece 102a2, the alignment of the components of clamped workpiece 102a2 in itself, optical inspection of the welds after welding operation, etc.

Sonotrode 116 is illustrated coupled to vacuum 118 (e.g., a vacuum source). Sonotrode 116 may define a vacuum channel (not illustrated) coupled to vacuum via piping 118a for receiving conductive pin 108 from a conductive pin supply (not illustrated).

Sonotrode 116 is illustrated carrying conductive pin 108 prior to an ultrasonic welding operation. A body portion 108a of conductive pin 108 is illustrated disposed with sonotrode 116. As will be appreciated by those skilled in the art, conductive pin 108 (and other conductive pins illustrated and/or described herein) is typically cylindrical symmetrical, and/or has a round cross section along its length. A pin head 108b (at a distal end of body portion 108a) is illustrated disposed underneath sonotrode 116. Details of conductive pin 108 and pin head 108b are illustrated in FIGS. 2A-2F, FIGS. 3A-3F, and FIGS. 4A-4D.

Ultrasonic welding system 100 is illustrated including a control system 120. Control system 120 is configured to control the welding process (e.g., welding conductive pin 108 to workpiece 102a1/102a2/102a3). The welding process includes ultrasonically welding a bonding surface of the conductive pin to the workpiece, the bonding surface including at least one of (i) a nonplanar surface and (ii) an aperture defined in a central region of the bonding surface. In certain embodiments, control system 120 is configured to apply process parameters during the welding process based on the bonding surface.

In one example, when the bonding surface includes a nonplanar surface, the control system may be configured to apply process parameters during the welding process based on the nonplanar surface.

In another example, when the bonding surface includes an aperture defined in the central region of the bonding surface, the control system may be configured to apply process parameters during the welding process based on the aperture defined in the central region.

In another example, when the bonding surface includes the nonplanar surface and the aperture defined in the central region of the nonplanar surface, the control system may be configured to apply process parameters during the welding process based on the nonplanar surface and the aperture defined in the central region of the nonplanar surface.

The process parameters may include one or more of bonding force, bonding energy, and bonding time. The welding process may utilize torsional vibration applied by the sonotrode.

Various types of workpieces may be welded using ultrasonic welding system 100 (or other systems within the scope of the invention). Exemplary workpieces include a power module, a lead frame and a battery module.

It will be appreciated that the term "power module" (sometimes referred to as a power electronic module), as used herein, relates to a module for containing one or more power components (e.g., power semiconductor elements or devices). Example power components include MOSFETs, IGBTs, BJTs, thyristors, GTPs, and JFETs. Such a module also typically includes a carrier (e.g., a power electronic substrate) for carrying the power components. As compared to discrete power semiconductors, power modules tend to provide a higher power density. As will be appreciated by those skilled in the art, the power modules illustrated in the drawings herein are simplified for ease of illustration.

Various types of ultrasonic motion may be imparted on a conductor (e.g., a conductive pin, a signal connector, a conductive terminal, a power terminal, etc.) in accordance with the invention. For example, the sonotrode may be configured to weld a conductor to a workpiece using at least one of linear ultrasonic motion and torsional ultrasonic motion.

Certain of those workpieces are configured to receive a conductive pin. As used herein, the term "conductive pin" is a conductive structure intended to be welded to a workpiece. The conductive pin may have a free end (after being welded to a workpiece), and a body portion of the conductive pin may extend substantially vertically from a "welded" end to the free end. The cross section of the conductive pin may be round, square, rectangular, or have any desired cross section. The term conductive pin shall also be construed to include conductive receptacles or sleeves (e.g., having a tubular shape such as a rivet), where the conductive receptacle/sleeve is ultrasonically welded to a workpiece, and configured to receive another conductive element. In accordance with certain exemplary embodiments, ultrasonic welding system 100 may include a conductive pin supply configured to provide a plurality of conductive pins for welding using sonotrode 116. Exemplary configurations for conductive pin supply include: a grid arrangement (including columns and rows of conductive pins, oriented in such a way for ease of pick up), a bowl feeder, a hopper, a spool, etc. Alternative configurations are contemplated. Such a conductive pin supply may be configured to operate with a buffer system so that pins are fed through a staging area, ready to be picked up for welding.

Exemplary embodiments of conductive pin 108 are illustrated in FIGS. 2A-2F, FIGS. 3A-3F, and FIGS. 4A-4D as conductive pin 208, conductive pin 308, and conductive pin 408, respectively.

Figures 2A, 2B, 2C:
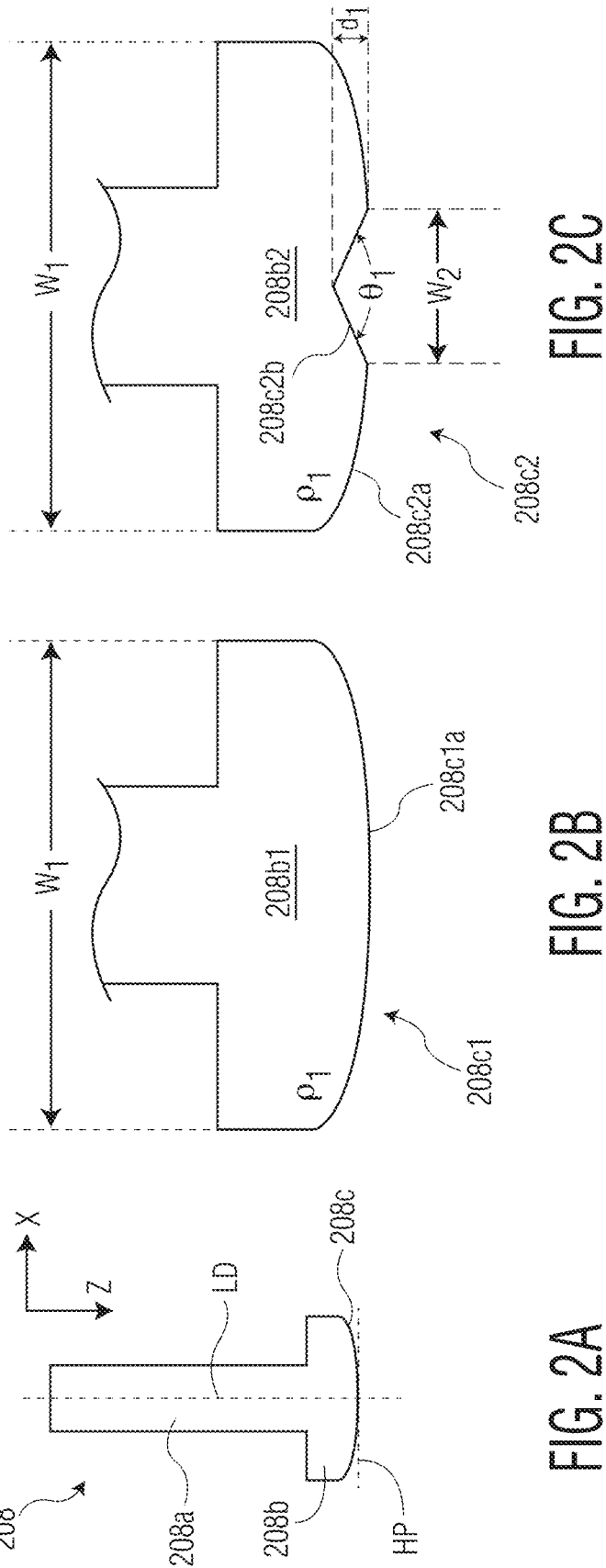
FIGS. 2A-2F are cross-sectional side views of conductive pins (or portions thereof) in accordance with various exemplary embodiments of the invention.

Referring specifically to FIG. 2A, conductive pin 208 is illustrated. Conductive pin 208 includes a body portion 208$a$. Conductive pin 208 also includes a pin head 208$b$ at a distal end (i.e., along the z-axis) of body portion 208$a$. Pin head 208$b$ defines a bonding surface 208$c$ configured to be ultrasonically welded to a workpiece. Bonding surface 208$c$ includes at least one of (i) a nonplanar surface and (ii) an aperture defined in a central region of bonding surface 208$c$. Longitudinal direction LD of body portion 208$a$ and horizontal plane HP are illustrated; horizontal plane HP is perpendicular to longitudinal direction LD of body portion 208$a$. Exemplary ranges for the overall length (or height) of conductive pin 208 (or any other conductive pin illustrated and/or described herein) are: 1 mm-100 mm; and 3 mm-30 mm. Other ranges are contemplated.

FIGS. 2B-2F illustrate various embodiments of conductive pin 208 including pin heads 208$b$1, 208$b$2, 208$b$3, 208$b$4, and 208$b$5, respectively. Throughout FIGS. 2B-2F, each respective pin head is illustrated having a width of $W_1$ and a curved surface (of bonding surface 208$c$) with a radius of curvature of $\rho_1$. Exemplary ranges for $W_1$ include: 0.5 mm-10 mm; and 1 mm-4 mm. Exemplary ranges for radius of curvature $\rho_1$ include: 1 mm-1000 mm; and 2 mm-100 mm. Other ranges are contemplated.

Referring specifically to FIG. 2B, pin head 208$b$1 is illustrated including bonding surface 208$c$1. Bonding surface 208$c$1 includes a nonplanar surface 208$c$1$a$; specifically, nonplanar surface 208$c$1$a$ is a curved surface. Nonplanar surface 208$c$1$a$ has a radius of curvature of $\rho_1$.

Referring now to FIG. 2C, pin head 208$b$2 is illustrated including bonding surface 208$c$2. Bonding surface 208$c$2 includes a nonplanar surface 208$c$2$a$; specifically, nonplanar surface 208$c$2$a$ is a curved surface. Bonding surface 208$c$2 further includes an aperture 208$c$2$b$ defined in the central region of bonding surface 208$c$2. Specifically, aperture 208$c$2$b$ is an angled aperture 208$c$2$b$. Aperture 208$c$2$b$ is illustrated as a conical aperture with a width $W_2$, an angle of $\theta_1$, and a maximum depth of $d_1$. An exemplary range for width $W_2$ is 0.1 mm-3 mm. Exemplary ranges for angle $\theta_1$ are: 60-170 degrees; and 90-120 degrees. Exemplary ranges for $d_1$ include: 10 $\mu$m-1000 $\mu$m; and 1 $\mu$m-3000 $\mu$m. Other ranges are contemplated.

Figures 2D, 2E, 2F:
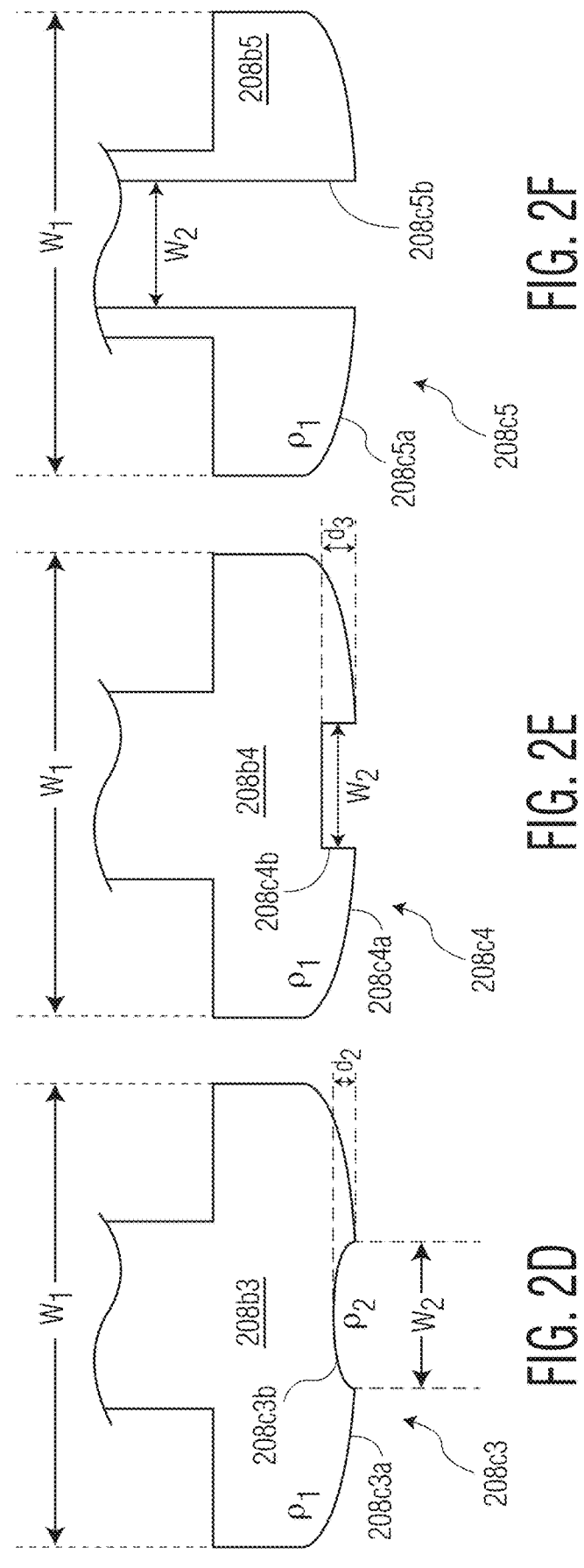

Referring now to FIG. 2D, pin head 208$b$3 is illustrated including bonding surface 208$c$3. Bonding surface 208$c$3 includes a nonplanar surface 208$c$3$a$; specifically, nonplanar surface 208$c$3$a$ is a curved surface. Bonding surface 208$c$3 further includes an aperture 208$c$3$b$ defined in the central region of bonding surface 208$c$3. Specifically, aperture 208$c$3$b$ is a curved aperture. Aperture 208$c$3$b$ is illustrated as a spherical cap aperture or a dome-shaped aperture with width $W_2$, a radius of curvature of $\rho_2$ and a maximum depth of $d_2$. An exemplary range for width $W_2$ is 0.1 mm-3 mm. Exemplary ranges for radius of curvature of $\rho_2$ include: 2 mm-100 mm; and 1 mm-1000 mm. Exemplary ranges for maximum depth $d_2$ include: 10 $\mu$m-1000 $\mu$m; and 1 $\mu$m-3000 $\mu$m. Other ranges are contemplated.

Referring now to FIG. 2E, pin head 208$b$4 is illustrated including bonding surface 208$c$4. Bonding surface 208$c$4 includes a nonplanar surface 208$c$4$a$; specifically, nonplanar surface 208$c$4$a$ is a curved surface. Bonding surface 208$c$4 further includes an aperture 208$c$4$b$ defined in the central region of bonding surface 208$c$4. Specifically, aperture 208$c$4$b$ is a cylindrical aperture. Aperture 208$c$4$b$ is illustrated with a width of $W_2$ and a maximum depth of $d_3$. An exemplary range for width $W_2$ is 0.1 mm-3 mm. Exemplary ranges for the maximum depth of $d_3$ include: 10 $\mu$m-1000 $\mu$m; and 1 $\mu$m-3000 $\mu$m. Other ranges are contemplated. It should be understood that aperture 208$c$4$b$ may be embodied as a rectangular-shaped aperture, an oval-shaped aperture, and other geometric shaped apertures.

Referring now to FIG. 2F, pin head 208$b$5 is illustrated including bonding surface 208$c$5. Bonding surface 208$c$5 includes a nonplanar surface 208$c$5$a$; specifically, nonplanar surface 208$c$5$a$ is a curved surface. Bonding surface 208$c$5 further includes an aperture 208$c$5$b$ defined in the central region of bonding surface 208$c$5. Specifically, aperture 208$c$5$b$ is a cylindrical aperture. Aperture 208$c$5$b$ is illustrated with a width of $W_2$ and extends through a length (e.g., the full length) of body portion 208$a$. An exemplary range for width $W_2$ is 0.1 mm-3 mm. Other ranges are contemplated. It should be understood that aperture 208$c$5$b$ may be embodied as a rectangular-shaped aperture, an oval-shaped aperture, a pyramidal-shaped aperture, and other geometric shaped apertures.

Figures 3A, 3B, 3C:
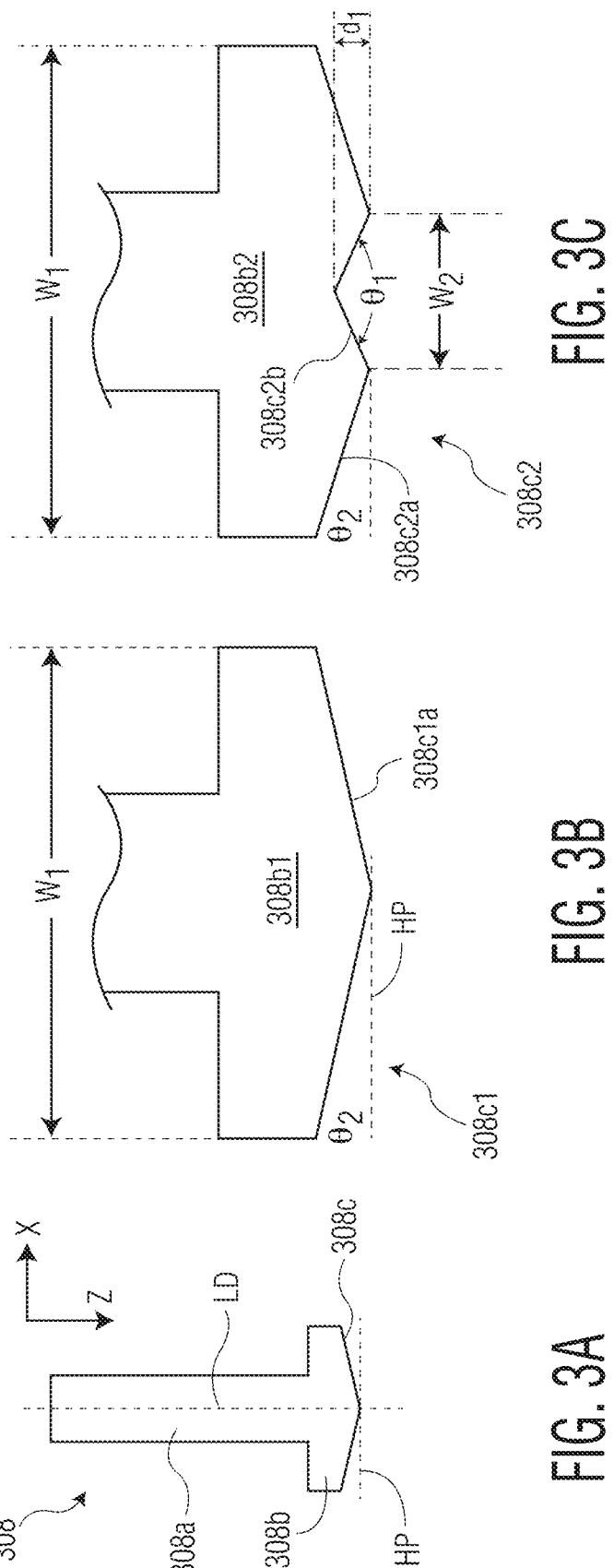
FIGS. 3A-3F are cross-sectional side views of conductive pins (or portions thereof) in accordance with various exemplary embodiments of the invention.

Referring now to FIG. 3A, conductive pin 308 is illustrated. Conductive pin 308 includes a body portion 308$a$. Conductive pin 308 also includes a pin head 308$b$ at a distal end (i.e., along the z-axis) of body portion 308$a$. Pin head 308$b$ defines a bonding surface 308$c$ configured to be ultrasonically welded to a workpiece. Bonding surface 308$c$ includes at least one of (i) a nonplanar surface and (ii) an aperture defined in a central region of bonding surface 308$c$. Longitudinal direction LD of body portion 308$a$ and horizontal plane HP are illustrated; horizontal plane HP is perpendicular to longitudinal direction LD of body portion 308$a$.

FIGS. 3B-3F illustrate various embodiments of conductive pin 308 including pin heads 308$b$1, 308$b$2, 308$b$3, 308$b$4, and 308$b$5, respectively. Throughout FIGS. 3B-3F, each respective pin head is illustrated having a width of $W_1$ and an angled surface of the bonding surface with an angle of $\theta_2$. The angled surface is configured at an angle $\theta_2$ with respect to horizontal plane HP. Exemplary ranges for $W_1$ include: 0.5 mm-10 mm; and 1 mm-4 mm. Exemplary ranges for the angle $\theta_2$ include: 1-15 degrees; and 1-45 degrees. Other ranges are contemplated.

Referring specifically to FIG. 3B, pin head 308b1 is illustrated including bonding surface 308c1. Bonding surface 308c1 includes a nonplanar surface 308c1a; specifically, nonplanar surface 308c1a is an angled surface. Nonplanar surface 308c1a has an angle of $\theta_2$.

Referring now to FIG. 3C, pin head 308b2 is illustrated including bonding surface 308c2. Bonding surface 308c2 includes a nonplanar surface 308c2a; specifically, nonplanar surface 308c2a is an angled surface. Bonding surface 308c2 further includes an aperture 308c2b defined in the central region of bonding surface 308c2. Specifically, aperture 308c2b is an angled aperture. Aperture 308c2b is illustrated as a conical aperture with an angle of $\theta_1$, a width $W_2$, and a maximum depth of $d_1$. Exemplary ranges for angle $\theta_1$ are: 60-170 degrees; and 90-120 degrees. An exemplary range for width $W_2$ is 0.1 mm-3 mm. Exemplary ranges for the maximum depth of $d_1$ include: 10 μm-1000 μm; and 1 μm-3000 μm. Other ranges are contemplated.

Figures 3D, 3E, 3F:
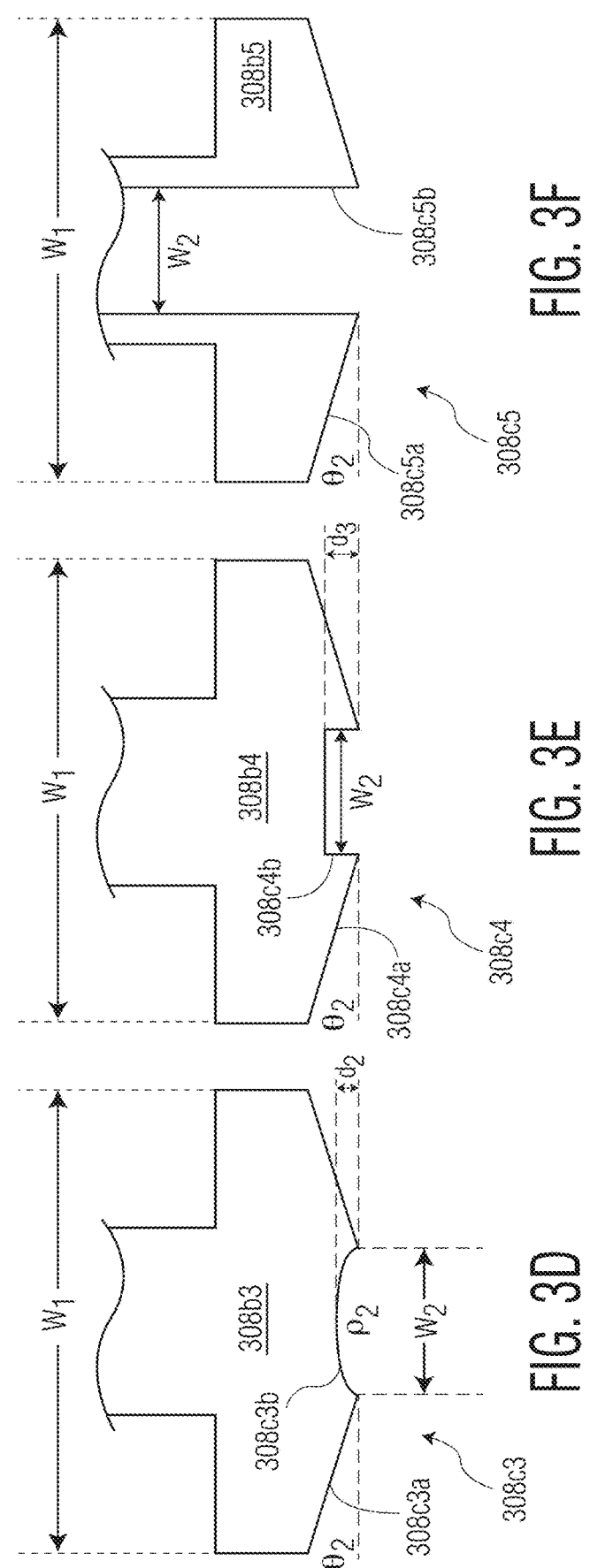

Referring now to FIG. 3D, pin head 308b3 is illustrated including bonding surface 308c3. Bonding surface 308c3 includes a nonplanar surface 308c3a; specifically, nonplanar surface 308c3a is an angled surface. Bonding surface 308c3 further includes an aperture 308c3b defined in the central region of bonding surface 308c3. Specifically, aperture 308c3b is a curved aperture. Aperture 308c3b is illustrated as a spherical cap aperture or a dome-shaped aperture with a radius of curvature of $\rho_2$, a width $W_2$, and a maximum depth of $d_2$. Exemplary ranges for radius of curvature of $\rho_2$ include: 2 mm-100 mm; and 1 mm-1000 mm. An exemplary range for width $W_2$ is 0.1 mm-3 mm.

Exemplary ranges for maximum depth $d_2$ include: 10 μm-1000 μm; and 1 μm-3000 μm. Other ranges are contemplated.

Referring now to FIG. 3E, pin head 308b4 is illustrated including bonding surface 308c4. Bonding surface 308c4 includes a nonplanar surface 308c4a; specifically, nonplanar surface 308c4a is an angled surface. Bonding surface 308c4 further includes an aperture 308c4b defined in the central region of bonding surface 308c4. Specifically, aperture 308c4b is a cylindrical aperture. Aperture 308c4b is illustrated with a width of $W_2$ and a depth of $d_3$. An exemplary range for width $W_2$ is 0.1 mm-3 mm. Exemplary ranges for the depth of $d_3$ include: 10 μm-1000 μm; and between 1 μm-3000 μm. Other ranges are contemplated. It should be understood that aperture 308c4b may be embodied as a rectangular-shaped aperture, an oval-shaped aperture, and other geometric shaped apertures.

Referring now to FIG. 3F, pin head 308b5 is illustrated including bonding surface 308c5. Bonding surface 308c5 includes a nonplanar surface 308c5a; specifically, nonplanar surface 308c5a is an angled surface. Bonding surface 308c5 further includes an aperture 308c5b defined in the central region of bonding surface 308c5. Specifically, aperture 308c5b is a cylindrical aperture. Aperture 308c5b is illustrated with a width of $W_2$ and extends through a length (e.g., the full length) of body portion 308a. An exemplary range for width $W_2$ is 0.1 mm-3 mm. Other ranges are contemplated. It should be understood that aperture 308c5b may be embodied as a rectangular-shaped aperture, an oval-shaped aperture, a pyramidal-shaped aperture, and other geometric shaped apertures.

Figure 4B:
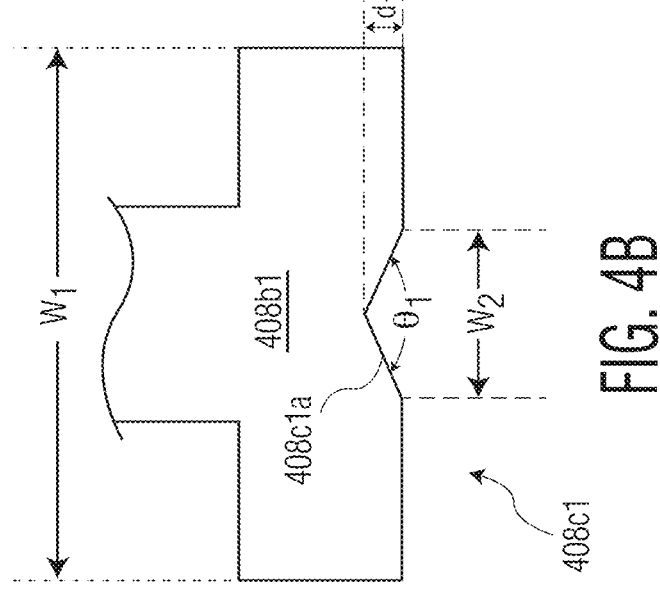
FIGS. 4A-4D are cross-sectional side views of conductive pins (or portions thereof) in accordance with various exemplary embodiments of the invention.
Figure 4A:
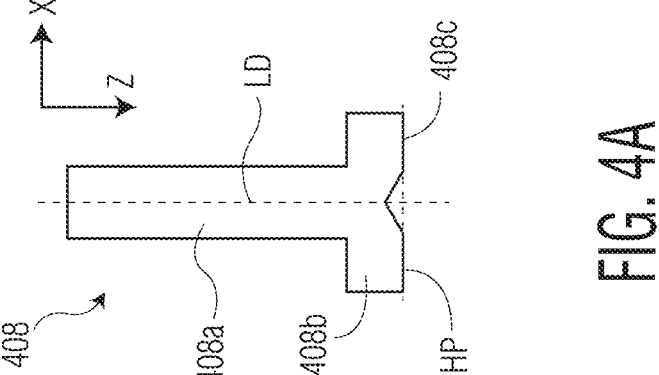

Referring now to FIG. 4A, conductive pin 408 is illustrated. Conductive pin 408 includes a body portion 408a. Conductive pin 408 also includes a pin head 408b at a distal end (i.e., along the z-axis) of body portion 408a. Pin head 408b defines a bonding surface 408c configured to be ultrasonically welded to a workpiece. Bonding surface 408c includes at least one of (i) a nonplanar surface and (ii) an aperture defined in a central region of bonding surface 408c. Longitudinal direction LD of body portion 408a and horizontal plane HP are illustrated; horizontal plane HP is perpendicular to longitudinal direction LD of body portion 408a.

Figure 4D:
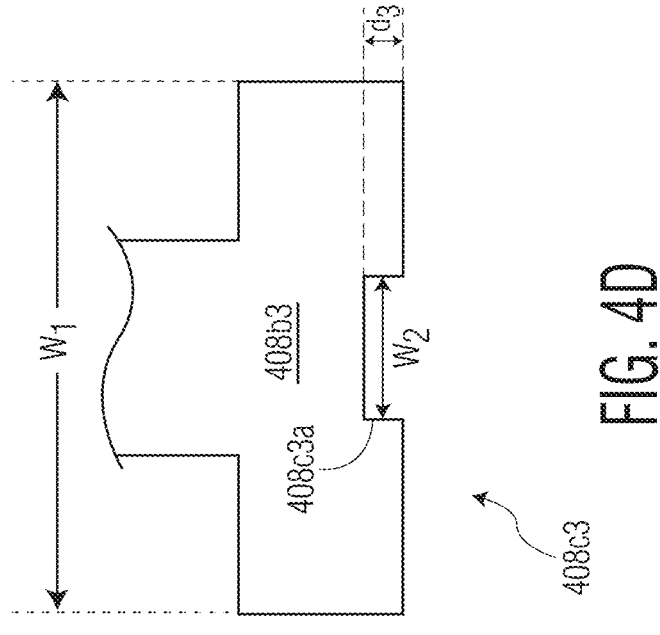
Figure 4C:
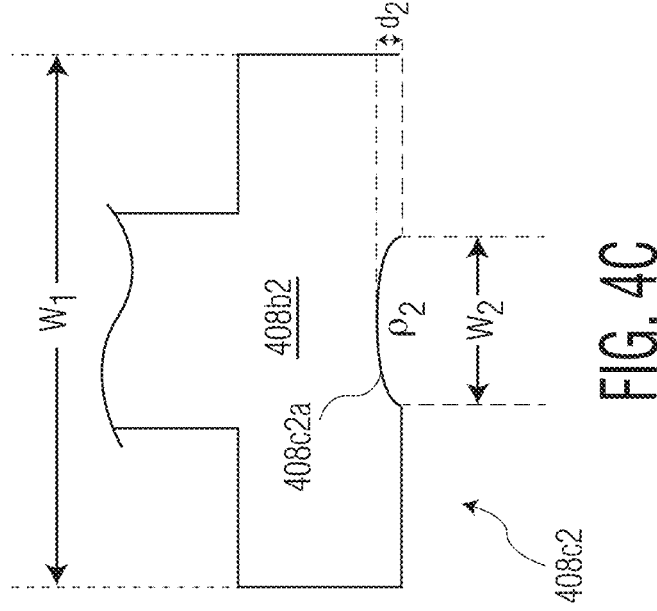

FIGS. 4B-4D illustrate various embodiments of conductive pin 408 including pin heads 408b1, 408b2, and 408b3, respectively. Throughout FIGS. 4B-4D, each respective pin head is illustrated having a width of $W_1$. Exemplary ranges for the width of $W_1$ include: 0.5 mm-10 mm; and 1 mm-4 mm. Other ranges are contemplated.

Referring now to FIG. 4B, pin head 408b1 is illustrated including bonding surface 408c1. Bonding surface 408c1 includes an aperture 408c1a defined in the central region of bonding surface 408c1. Specifically, aperture 408c1a is an angled aperture. Aperture 408c1a is illustrated as a conical aperture with an angle of $\theta_1$, a width $W_2$, and a maximum depth of $d_1$. Exemplary ranges for angle $\theta_1$ are: 60-170 degrees; and 90-120 degrees. An exemplary range for width $W_2$ is 0.1 mm-3 mm. Exemplary ranges for the maximum depth of $d_1$ include: 10 μm-1000 μm; and between 1 μm-3000 μm. Other ranges are contemplated.

Referring now to FIG. 4C, pin head 408b2 is illustrated including bonding surface 408c2. Bonding surface 408c2 includes an aperture 408c2a defined in the central region of bonding surface 408c2. Specifically, aperture 408c2a is a curved aperture. Aperture 408c2a is illustrated as a spherical cap aperture or a dome-shaped aperture with a radius of curvature of $\rho_2$, a width $W_2$, and a maximum depth of $d_2$. Exemplary ranges for radius of curvature of $\rho_2$ include: 2 mm-100 mm; and 1 mm-1000 mm. An exemplary range for width $W_2$ is 0.1 mm-3 mm. Exemplary ranges for the maximum depth of $d_2$ include: 10 μm-1000 μm; and between 1 μm-3000 μm. Other ranges are contemplated.

Referring now to FIG. 4D, pin head 408b3 is illustrated including bonding surface 408c3. Bonding surface 408c3 includes an aperture 408c3a defined in the central region of bonding surface 408c3. Specifically, aperture 408c3a is a cylindrical aperture. Aperture 408c3a is illustrated with a width of $W_2$ and a maximum depth of $d_3$. An exemplary range for width $W_2$ is 0.1 mm-3 mm. Exemplary ranges for the maximum depth of $d_3$ include: 10 μm-1000 μm; and 1 μm-3000 μm. Other ranges are contemplated. It should be understood that aperture 408c3a may be embodied as a rectangular-shaped aperture, a pyramidal-shaped aperture, an oval-shaped aperture, and other geometric shaped apertures.

Throughout FIGS. 2C-2F, FIGS. 3C-3F, and FIGS. 4B-4D, the various apertures are illustrated and described as geometric shapes, such as conical apertures, spherical cap/dome-shaped apertures, cylindrical apertues, etc. It should be understood that these descriptions are exemplary in nature and not intended to limit the scope of the embodiments. For example, the "conical" apertures of FIG. 2C, FIG. 3C, and FIG. 4B are intended to encompass similar apertures, such as a truncated-cone shaped aperture, an asymetrical cone-like shaped aperture, and the like. In another example, the "spherical cap/dome-shaped" apertures of FIG. 2D, FIG. 3D, and FIG. 4C are intended to encompass similar apertures, such as a spheroid (or ellipsoid of revolution or rotational ellipsoid) shaped aperture, an asymetrical sphere-like shaped aperture, and the like.

It should be understood that conductive pins described herein may be formed from a copper material. While copper (or copper alloy) conductive pins (and terminals and busbars) are described herein, it is understood that the invention (and the associated terminals, busbars, and methods) are not limited to copper materials. The conductive pins may be made from other conductive materials, such as aluminum.

Figure 5:
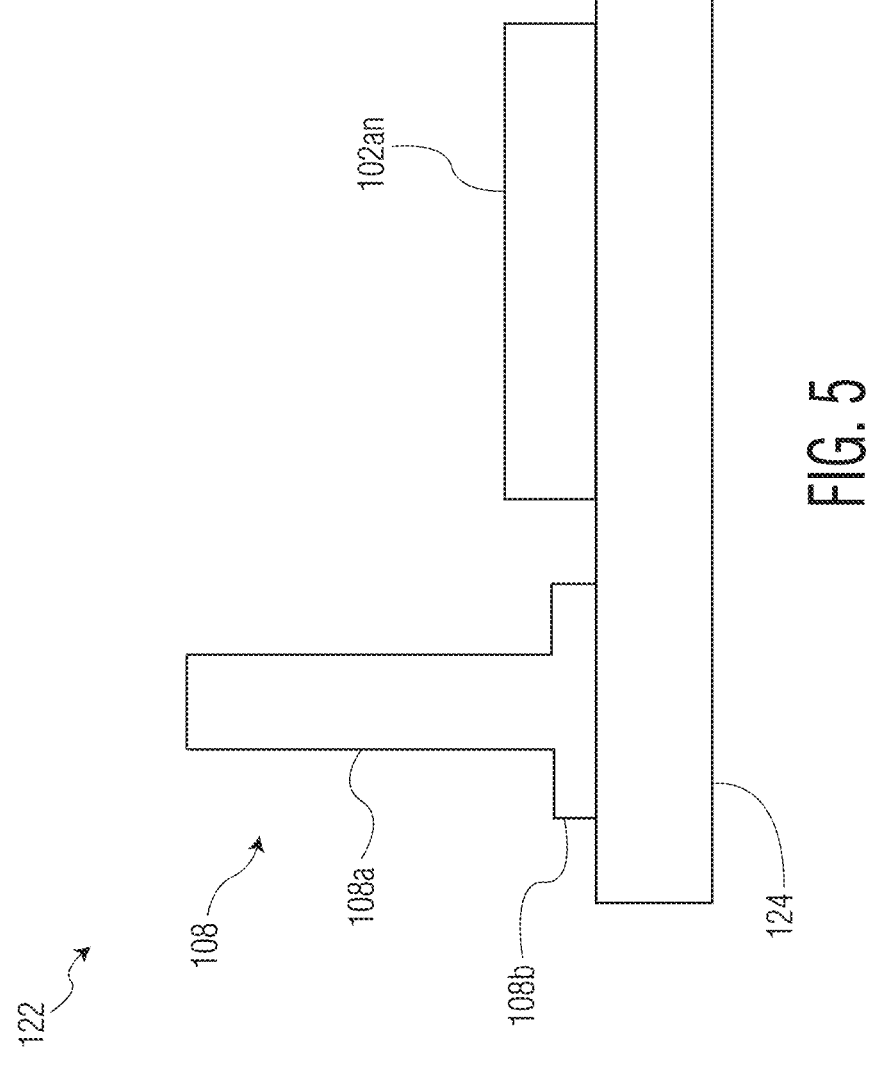
FIG. 5 is a block diagram side view of a power module in accordance with an exemplary of the invention.

Referring now to FIG. 5, a power module 122 (a specific type of workpiece) is illustrated. Power module 122 includes a semiconductor element 102*an*. As used herein, the term "semiconductor element" is intended to refer to any structure including (or configured to include at a later step) a semiconductor chip or die (e.g., a power semiconductor element). Exemplary semiconductor elements include a substrate (e.g., a leadframe, a PCB, a carrier, etc.), a substrate carrying one or more semiconductor die, a bare semiconductor die, a packaged semiconductor device, a flip chip semiconductor device, a die embedded in a substrate, a stack of semiconductor die, amongst others. Further, the semiconductor element may include an element configured to be bonded or otherwise included in a semiconductor package (e.g., a spacer to be bonded in a stacked die configuration, a substrate, etc.).

Power module 122 also includes a carrier 124 for supporting semiconductor element 102*an*. Power module 122 also includes at least one conductive pin 108 (e.g., conductive pin 208 of FIGS. 2A-2F, conductive pin 308 of FIGS. 3A-3F, and/or conductive pin 408 of of FIGS. 4A-4D) ultrasonically welded to carrier 124. Conductive pin 108 includes body portion 108*a* and pin head 108*b* at one end of body portion 108*a*. Prior to ultrasonic welding, pin head 108*b* included a bonding surface configured to be ultrasonically welded to a workpiece (e.g., carrier 124). The bonding surface of conductive pin 108, prior to being ultrasonically welded to the carrier, included at least one of (i) a nonplanar surface and (ii) an aperture defined in a central region of the bonding surface.

In FIG. 5, conductive pin 108 is illustrated having been bonded to carrier 124. It should be understood that FIG. 5 illustrates a very simplified form of power module 122; details are omitted for simplicity.

FIG. 6 is a flow diagram illustrating a method of ultrasonically welding a conductive pin to a workpiece. As is understood by those skilled in the art, certain steps included in the flow diagram may be omitted; certain additional steps may be added; and the order of the steps may be altered from the order illustrated—all within the scope of the invention.

At Step 600, a workpiece (e.g., workpiece 102*a*1/102*a*2/102*a*3 of FIG. 1, carrier 124 of FIG. 5) is provided.

At Step 602, a conductive pin (e.g., conductive pin 108 of FIG. 1, conductive pin 208 of FIGS. 2A-2F, conductive pin 308 of FIGS. 3A-3F, conductive pin 408 of FIGS. 4A-4D) is ultrasonically welded to the workpiece. The conductive pin includes a body portion and a pin head at one end of the body portion. The pin head defines a bonding surface configured to be ultrasonically welded to a workpiece, the bonding surface including at least one of (i) a nonplanar surface and (ii) an aperture defined in a central region of the bonding surface.

In certain embodiments, Step 602 includes applying process parameters, using a control system (e.g., control system 120 of FIG. 1), during the ultrasonic welding based on the bonding surface.

In certain embodiments, Step 602 includes applying process parameters, using a control system (e.g., control system 120 of FIG. 1), during the ultrasonic welding based on the nonplanar surface.

In certain embodiments, Step 602 includes applying process parameters, using a control system (e.g., control system 120 of FIG. 1), during the ultrasonic welding based on the aperture defined in the central region.

In certain embodiments, Step 602 includes applying process parameters, using a control system (e.g., control system 120 of FIG. 1), during the ultrasonic welding based on the nonplanar surface and the aperture defined in the central region of the nonplanar surface.

In certain embodiments, Step 602 includes applying process parameters, using a control system (e.g., control system 120 of FIG. 1), during the ultrasonic welding, wherein the process parameters include at least one of bonding force, bonding energy, and bonding time.

In certain embodiments, Step 602 includes applying process parameters, using a control system (e.g., control system 120 of FIG. 1), during the ultrasonic welding, wherein the ultrasonic welding utilizes torsional vibration applied by a sonotrode configured to ultrasonically weld the conductive pin to the workpiece during a welding process.

Although the invention is illustrated and described herein with reference to specific embodiments, the invention is not intended to be limited to the details shown. Rather, various modifications may be made in the details within the scope and range of equivalents of the claims and without departing from the invention.

What is claimed:

1. A method of ultrasonically welding a conductive pin to a workpiece, the method comprising steps of:
   (a) providing the workpiece; and
   (b) ultrasonically welding a bonding surface of the conductive pin to the workpiece to create a welded side of the conductive pin, the conductive pin including a body portion, and a pin head at one end of the body portion, the pin head defining the bonding surface configured to be ultrasonically welded to the workpiece, the bonding surface including a conical aperture defined in a central region of the bonding surface.

2. The method of claim 1 wherein step (b) includes applying process parameters, using a control system, during the ultrasonic welding based on the bonding surface.

3. The method of claim 1 wherein the workpiece includes at least one of a power module, a lead frame, and a battery module.

4. The method of claim 1 wherein step (b) includes applying process parameters, using a control system, during the ultrasonic welding based on the aperture defined in the central region.

5. The method of claim 1 wherein the bonding surface further includes a nonplanar surface, and step (b) includes applying process parameters, using a control system, during the ultrasonic welding based on the nonplanar surface and the aperture defined in the central region of the nonplanar surface.

6. The method of claim 1 wherein step (b) includes applying process parameters, using a control system, during the ultrasonic welding, wherein the process parameters include at least one of bonding force, bonding energy, and bonding time.

7. The method of claim 1 wherein step (b) includes applying process parameters, using a control system, during the ultrasonic welding, wherein the ultrasonic welding utilizes torsional vibration applied by a sonotrode configured to ultrasonically weld the conductive pin to the workpiece.

8. The method of claim 1 wherein the aperture has a width of 0.1-3 mm.

9. The method of claim 1 wherein the aperture includes an angle of 60-170 degrees.

10. The method of claim 1 wherein the aperture includes a depth of 10-1000 μm.

11. A method of ultrasonically welding a conductive pin to a workpiece, the method comprising steps of:

(a) providing the workpiece; and (b) ultrasonically welding the conductive pin to the work-piece, the conductive pin including a body portion, and a pin head at one end of the body portion, the pin head defining a bonding surface configured to be ultrasonically welded to the workpiece, the bonding surface including a nonplanar surface, and an aperture defined in a central region of teh bonding surface, wherein the conductive pin, including the pin head, has a round cross section along its length in a direction from the bonding surface towards the body portion.

12. The method of claim 11 wherein step (b) includes applying process parameters, using a control system, during the ultrasonic welding based on the bonding surface.

13. The method of claim 11 wherein step (b) includes applying process parameters, using a control system, during the ultrasonic welding based on the nonplanar surface.

14. The method of claim 11 wherein step (b) includes applying process parameters, using a control system, during the ultrasonic welding based on the nonplanar surface and the aperture.

15. The method of claim 11 wherein step (b) includes applying process parameters, using a control system, during the ultrasonic welding, wherein the process parameters include at least one of bonding force, bonding energy, and bonding time.

16. The method of claim 11 wherein step (b) includes applying process parameters, using a control system, during the ultrasonic welding, wherein the ultrasonic welding utilizes torsional vibration applied by a sonotrode configured to ultrasonically weld the conductive pin to the workpiece.

17. The method of claim 11 wherein the workpiece includes at least one of a power module, a lead frame, and a battery module.

18. The method of claim 11 wherein the nonplanar surface includes a curved surface having a radius of curvature of 1-1000 mm.

19. The method of claim 11 wherein the nonplanar surface includes a curved surface having a radius of curvature of 2-100 mm.

* * * * *